United States Patent
Wada et al.

(10) Patent No.: US 7,782,662 B2
(45) Date of Patent: Aug. 24, 2010

(54) STORAGE DEVICE

(75) Inventors: Masaharu Wada, Yokohama (JP);
Takehiko Hojo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 12/181,926

(22) Filed: Jul. 29, 2008

(65) Prior Publication Data

US 2009/0040809 A1 Feb. 12, 2009

(30) Foreign Application Priority Data

Aug. 8, 2007 (JP) .............................. 2007-207128

(51) Int. Cl.
G11C 11/50 (2006.01)
G11C 5/06 (2006.01)
G11C 11/00 (2006.01)

(52) U.S. Cl. ..................... 365/164; 365/63; 365/148; 365/163

(58) Field of Classification Search .................. 365/63, 365/148, 163, 164
See application file for complete search history.

(56) References Cited

U.S. PATENT DOCUMENTS

| 7,263,027 B2 | 8/2007 | Kim et al. | |
| 7,425,720 B2 * | 9/2008 | Kaeriyama et al. | ............. 257/4 |
| 2008/0284494 A1 | 11/2008 | Yamauchi et al. | |

FOREIGN PATENT DOCUMENTS

| JP | 2004-342843 | 12/2004 |
| JP | 2005-244101 | 9/2005 |
| JP | 2007-073576 | 3/2007 |

OTHER PUBLICATIONS

Japanese Office Action for 2007-207128 mailed on Dec. 1, 2009.

* cited by examiner

*Primary Examiner*—Ly D Pham
(74) *Attorney, Agent, or Firm*—Turocy & Watson, LLP (57) ABSTRACT

A storage device includes: a wiring including a first conductor with a first conductivity; and first, second and third contacts, each including a second conductor with a second conductivity and contacting the wiring. The storage device also includes: a write switching circuit controlling current for writing information that flows through the first contact, the wiring, and the second contact, and changing resistance values of the first contact to write information; and a read switching circuit controlling current for reading information that flows through the first contact, the wiring, and the third contact.

10 Claims, 5 Drawing Sheets

STORAGE DEVICE

CROSS REFERENCE TO RELATED APPLICATIONS

This application is based on and claims the benefit of priority from prior Japanese Patent Application No. 2007-207128, filed on Aug. 8, 2007, the entire contents of which are incorporated herein by reference.

BACKGROUND OF THE INVENTION

1. Field of the Invention

The present invention relates to a storage device, and in particular, to a storage device for storing information by changing resistance values of elements.

2. Description of the Related Art

Conventionally, storage elements are used to configure a storage device for storing information by changing their resistance values. One of such storage elements include variable resistive elements in which resistance values vary with the polarity of applied voltage. The variable resistive elements are switched to a high-resistance state when a voltage with a certain polarity applied, while being switched to a low-resistance state when a voltage with another polarity applied. For example, information can be stored through such correspondence wherein "1" and "0" correspond to the high- and low-resistance states, respectively.

In a storage device using such variable resistive elements, read operations may be performed using a voltage with polarity opposite to that of the applied voltage in write operation to the elements. In such cases, resistance values of variable resistive elements that vary with write voltage will vary with read voltage, so will the content of the written information. To reduce such variance in resistance values, some configurations are known for applying a read voltage as well as another voltage with inverse polarity and other configurations for changing polarity of a read voltage itself (see, Japanese Patent Laid-Open No. 2006-66052 and 2006-190376). However, such configurations require an additional circuit for controlling direction of applying read voltage. Thus, additional complexity is introduced in configuring a storage device including a power supply and other reading circuits, which may cause some problems.

SUMMARY OF THE INVENTION

One aspect of the present invention provides a storage device comprises: a wiring including a first conductor with a first conductivity; first, second and third contacts, each including a second conductor with a second conductivity and contacting the wiring; a write switching circuit controlling current for writing information that flows through the first contact, the wiring, and the second contact, and changing resistance values of the first contact to write information; and a read switching circuit controlling current for reading information that flows through the first contact, the wiring, and the third contact.

In addition, another aspect of the present invention provides a storage device comprising: a wiring including a first conductor with a first conductivity; first, second and third contacts, each including a second conductor with a second conductivity and contacting the wiring; a write switching circuit controlling current for writing information that flows from the second contact through the wiring to the first contact, and changing resistance values of the first contact to write information; and a read switching circuit controlling current for reading information that flows through the first contact, the wiring, and the third contact.

In addition, another aspect of the present invention provides a storage device comprising: a wiring including a first conductor with a first conductivity; first, second and third contacts, each including a second conductor with a second conductivity and contacting the wiring; a write switching circuit controlling current for writing information that flows from the first contact through the wiring to the second contact, and changing resistance values of the first contact to write information; and a read switching circuit controlling current for reading information that flows through the first contact, the wiring, and the third contact.

DETAILED DESCRIPTION OF THE EMBODIMENTS

First Embodiment

Figure 1:
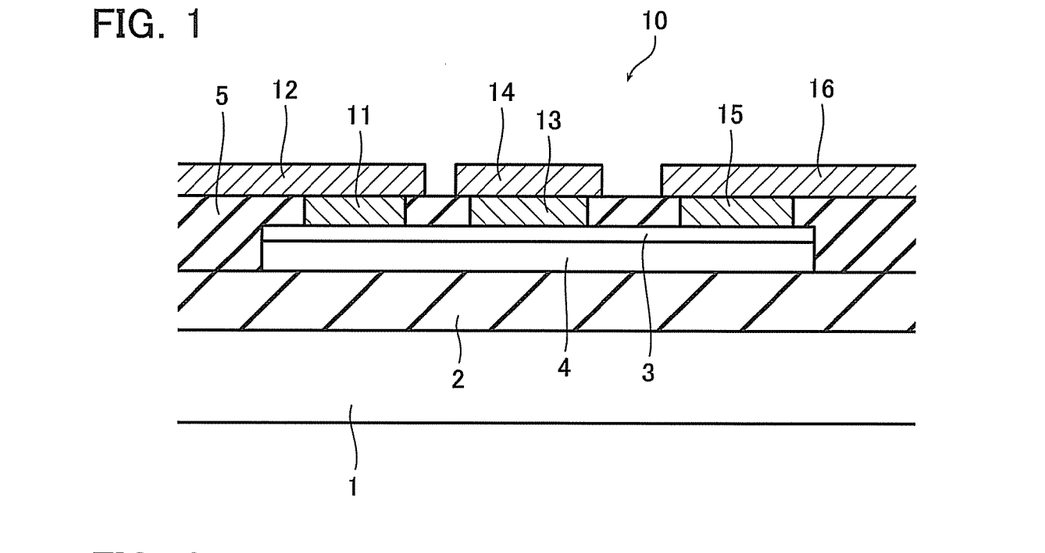
FIG. 1 is a cross-sectional view of a storage element used in a storage device according to a first embodiment of the present invention.
Figure 2:
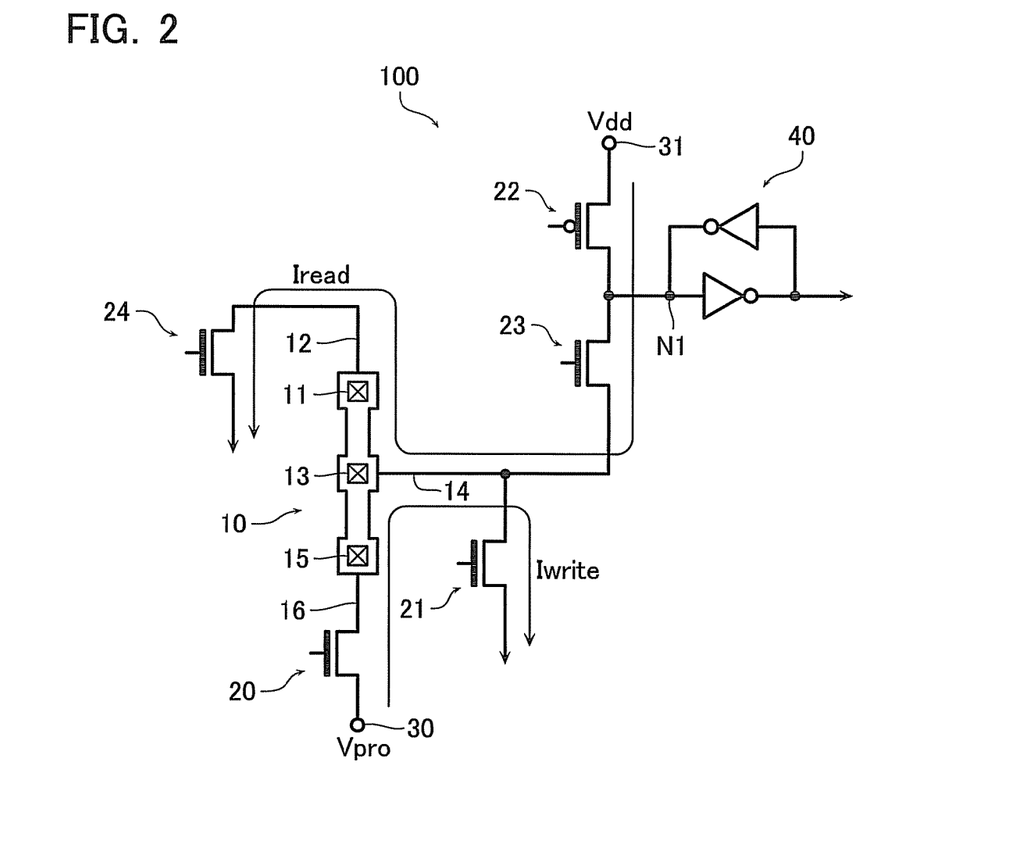
FIG. 2 is a circuit diagram of the storage device according to the first embodiment of the present invention.

A first embodiment of the present invention will now be described below with reference to the accompanying drawings. FIG. 1 is a cross-sectional view of a storage element 10 used in a storage device 100 according to this embodiment. FIG. 2 is a circuit diagram of the storage device 100 according to this embodiment.

As illustrated in FIG. 1, the storage element 10 used in the storage device 100 according to this embodiment has an insulating film 2 formed through, e.g., thermal oxidation, on a silicon substrate 1. A polysilicon wiring 4 using polysilicon, for example, is formed on the insulating film 2 as a first conductor with a first conductivity. A silicide 3 is formed on the polysilicon wiring 4 to reduce resistance of the polysilicon wiring 4. An interlayer insulating film 5 is formed on the insulating film 2 including the upper portion of the polysilicon wiring 4. The interlayer insulating film 5 has contact holes formed therein such that extend from its surface to the polysilicon wiring 4. This embodiment includes three contact holes formed in line along the polysilicon wiring 4. Within the contact holes, for example, tungsten (W) is embedded through sputtering to form contacts 11, 13 and 15 as second conductors with a different conductivity than that of polysilicon. Wirings 12, 14 and 16 of, e.g., copper (Cu) are selectively formed on the interlayer insulating film 5. The wirings 12, 14 and 16 are electrically connected to the silicide 3 and the polysilicon wiring 4, via the contacts 11, 13 and 15, respectively. Each of the contacts 11, 13 and 15 is embedded so as to electrically contact the wiring 4 through the silicide 3. The contact 13 is located between the contacts 11 and 15.

In the storage device 100 according to this embodiment, the wiring 16 of the storage element 10 is connected to the source of an NMOS transistor 20 as illustrated in FIG. 2. The drain of the NMOS transistor 20 is connected to a power supply 30 that provides a program potential Vpro. In addition, the wiring 14 of the storage element 10 is connected to the drain of an NMOS transistor 21 and the source of the NMOS transistor 21 is set to a ground potential. The NMOS transistors 20, 21 and the power supply 30 together configure a write switching circuit.

In addition, the wiring 14 of the storage element 10 is connected to the source of an NMOS transistor 23, the drain of which is in turn connected to the drain of a PMOS transistor 22. The source of the PMOS transistor 22 is connected to a power supply 31 that provides a power supply potential Vdd. In addition, the drain of the NMOS transistor 23 is connected to an input node N1 of a latch circuit 40 including two invertors. The wiring 12 of the storage element 10 is connected to the drain of an NMOS transistor 24. The NMOS transistors 23, 24, the PMOS transistor 22 and the power supply 31 together configure a read switching circuit.

Next, description is made to how the storage device according to this embodiment works in comparison to a storage device in a comparative example.

Figure 9:
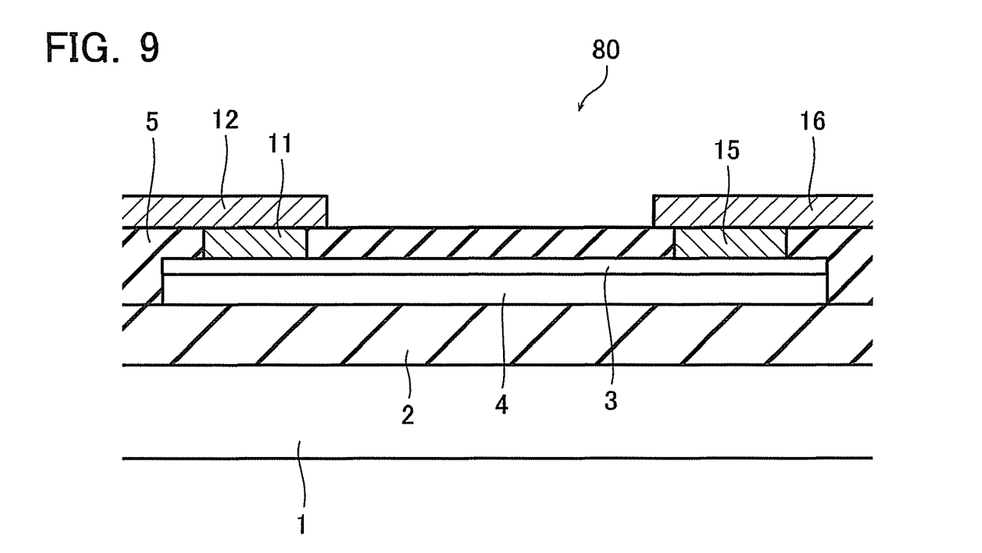
FIG. 9 is a cross-sectional view of a storage element used in a storage device in a comparative example.
Figure 10:
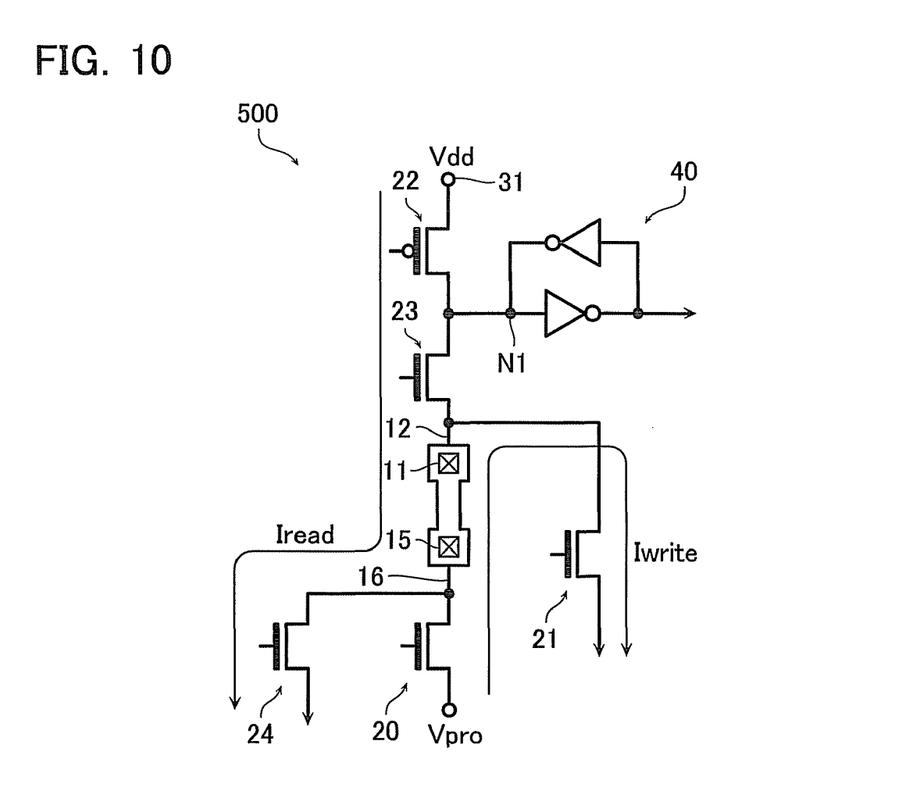
FIG. 10 is a circuit diagram of the storage device in the comparative example.

FIG. 9 is a cross-sectional view of a storage element 80 used in a storage device 500 in the comparative example. The storage element 80 used in the storage device 500 of the comparative example is different from the storage element 10 of the first embodiment in that it does not have any wiring 14 and contact 13 formed therein. FIG. 10 is a circuit diagram of the storage device 500 in the comparative example. For the storage device 500 in the comparative example, the same reference numerals represent the same configuration and elements as the first embodiment.

In the storage device 500 in the comparative example, the wiring 16 of the storage element 80 is connected to the source of the NMOS transistor 20. The drain of the NMOS transistor 20 is connected to the power supply that provides a program potential Vpro. In addition, the wiring 12 of the storage element 80 is connected to the drain of the NMOS transistor 21 and the source of the NMOS transistor 21 is set to a ground potential. The NMOS transistors 20, 21 and the power supply 30 together configure a write switching circuit.

In addition, the wiring 12 of the storage element 80 is connected to the source of the NMOS transistor 23, the drain of which is in turn connected to the drain of the PMOS transistor 22. The source of the PMOS transistor 22 is connected to the power supply 31 that provides a power supply potential Vdd. In addition, the drain of the NMOS transistor 23 is connected to an input node N1 of a latch circuit 40 including two invertors. The wiring 16 of the storage element 80 is connected to the drain of the NMOS transistor 24. The NMOS transistors 23, 24, the PMOS transistor 22 and the power supply 31 together configure a read switching circuit. Thus, the storage device 500 of the comparative example includes two terminals without the wiring 14 and the contact 13 and, hence, it is different from the storage device 100 of the first embodiment where three terminals are involved.

Firstly, the operation of writing information in the storage device 500 in the comparative example will be described below. The NMOS transistors 20 and 21 of the storage device 500 are switched to on state, while the NMOS transistors 23 and 24 as well as the PMOS transistor 22 are switched to off state. As a result, a program potential Vpro provided by the power supply 30 is applied via the NMOS transistor 20 to the storage element 80. A write current Iwrite first flows through the wiring 16 to the contact 15, then through the polysilicon wiring 4 to the contact 11 and to the wiring 12. Then, it flows to the NMOS transistor 21 in its on state. At this moment, since electrons flow in the opposite direction to that of the write current Iwrite, the electrons in the storage element 80 flow from the wiring 12 to the contact 11, then through the polysilicon wiring 4 to the contact 15 and to the wiring 16. In this case, some atoms of tungsten that constitute the contact 11 travel along the course of the electrons within the polysilicon wiring 4 to be deposited adjacent to the contact 15. As some atoms of tungsten that constitute the contact 11 are leaked, resistance values of the contact 11 are increased accordingly. For example, information is written to the storage element 80 through such correspondence wherein "1" and "0" correspond to high- and low-resistance states of the contact 11, respectively.

Secondly, the operation of reading information in the storage device 500 in the comparative example will be described below. The PMOS transistor 22 of the storage device 500 is first switched to on state and the NMOS transistors 20, 21, 23 and 24 are switched to off state, thereby providing a high-potential state in the input node N1 of the latch circuit 40. Then, the PMOS transistor 22 is switched to off state and the NMOS transistors 23 and 24 are switched to on state. Such a high potential of the input node N1 is provided through the NMOS transistor 23 to the storage element 80. The resulting read current Iread flows from the wiring 12 to the contact 11, then through the polysilicon wiring 4 to the contact 15 and to the wiring 16. Then, the read current Iread flows to the NMOS transistor 24 in its on state. At this moment, if the above-mentioned write operation is not performed, the contact 11 of the storage element 80 is in a low-resistance state. In this case, a read current Iread flows through the storage element 80 to the NMOS transistor 24, thereby providing a low potential state in the input node N1 of the latch circuit 40. Alternatively, if the write operation is performed, the contact 11 of the storage element 80 is in a high-resistance state. In the latter case, a read current Iread is prevented from flowing through the storage element 80 to the NMOS transistor 24 and thus the input node N1 of the latch circuit 40 remains in a high-potential state. The latch circuit 40 retains the information written to the storage element 80 by means of such high- and low-potential states of the input node N1.

In the comparative example, when an operation of reading information is performed in the storage device 500, a read current Iread flows to the storage element 80 in the opposite direction to that of the write current Iwrite in write operation. The tungsten deposited adjacent to the contact 15 in read operation travels in the opposite direction to that in write operation, due to the electrons flowing from the contact 15 to the contact 11. Since resistance values of the contact 11 are changed by the atoms of tungsten returning to the contact 11, the content of the written information can be changed.

Referring now to FIGS. 1 and 2, description is made to the operation of writing information in the storage device 100 of the first embodiment. The NMOS transistors 20 and 21 of the storage device 100 are switched to on state and the NMOS transistors 23 and 24 as well as the PMOS transistor 22 are switched to off state. As a result, a program potential Vpro provided by the power supply 30 is applied via the NMOS transistor 20 to the storage element 10. A write current Iwrite flows through the wiring 16 to the contact 15, then through the polysilicon wiring 4 to the contact 13 and to the wiring 14. Then, it flows to the NMOS transistor 21 in its on state. As with the storage device 500 in the comparative example, some atoms of tungsten that constitute the contact 13 travel along the course of the electrons within the polysilicon wiring 4 to be deposited adjacent to the contact 15. Resistance values of the contact 13 are increased due to the leakage of some atoms of tungsten that constitute the contact 13. In this way, information is written to the storage element 10.

Next, the operation of reading information in the storage device 100 of the first embodiment will be described below. The PMOS transistor 22 of the storage device 100 is first switched to on state and the NMOS transistors 20, 21, 23 and 24 are switched to off state, thereby providing a high-potential state in the input node N1 of the latch circuit 40. Then, the PMOS transistor 22 is switched to off state and the NMOS transistors 23 and 24 are switched to on state. Such a high potential of the input node N1 is provided through the NMOS transistor 23 to the storage element 10. The resulting read current Iread flows from the wiring 14 to the contact 13, then through the polysilicon wiring 4 to the contact 11 and to the wiring 12. Then, the read current Iread flows to the NMOS transistor 24 in its on state. At this moment, if the above-mentioned write operation is not performed, the contact 13 of the storage element 10 is in a low-resistance state. In this case, a read current Iread flows through the storage element 10 to the NMOS transistor 24, thereby providing a low-potential state in the input node N1 of the latch circuit 40. Alternatively, if the write operation is performed, the contact 13 of the storage element 10 is in a high-resistance state. In the latter case, a read current Iread is prevented from flowing through the storage element 10 to the NMOS transistor 24 and the input node N1 of the latch circuit 40 remains in a high-potential state. The latch circuit 40 retains the information written to the storage element 10 by means of such high- and low-potential states of the input node N1.

The storage device 100 in this embodiment includes a different read current Iread in read operation than that of the storage device 500 in the comparative example in that the read current Iread does not flow through the contact 15 adjacent to which tungsten is deposited. Accordingly, the tungsten deposited adjacent to the contact 15 will not return to the contact 13 due to the read current Iread. Since the contact 13 remains in a high-resistance state, the content of the already-written information may be retained without change and thus read in an accurate manner.

As can be seen from the above, according to the storage device 100 of the first embodiment, already-written information cannot be changed due to the voltage applied in an operation of reading information.

Second Embodiment

Figure 3:
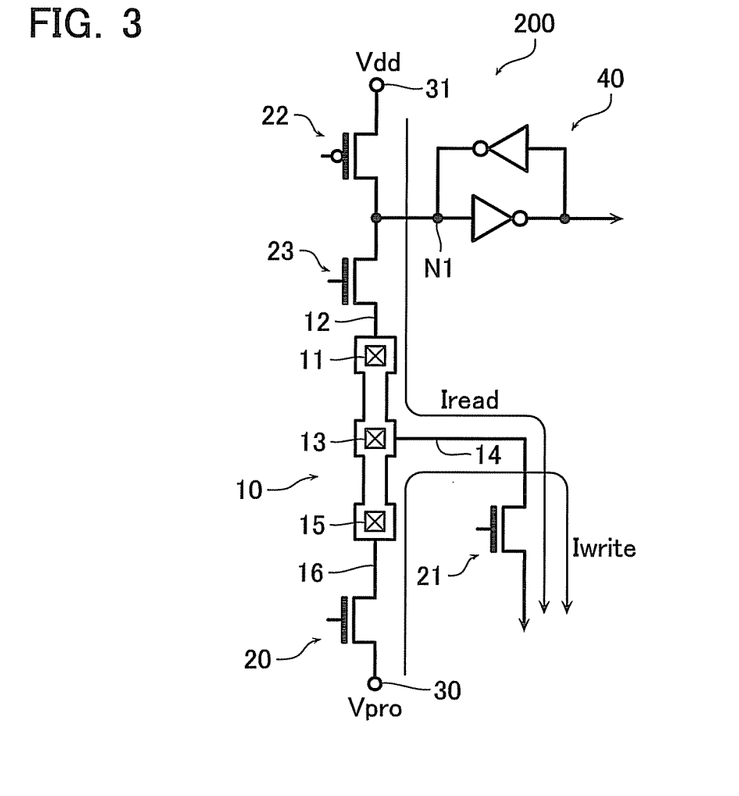
FIG. 3 is a circuit diagram of a storage device according to a second embodiment of the present invention.

A second embodiment of the present invention will now be described below with reference to the accompanying drawings. FIG. 3 is a circuit diagram of a storage device 200 according to the second embodiment. The same reference numerals represent the same elements as the first embodiment. The configuration of the storage element 10 used in the storage device 200 according to this embodiment is the same as the first embodiment illustrated in FIG. 1.

In the storage device 200 according to this embodiment, a write switching circuit configured by the NMOS transistors 20 and 21 as well as the power supply 30 is the same as that of the storage device 100 according to the first embodiment. In this embodiment, the storage device 200 is different from the storage device 100 of the first embodiment in view of the following. That is, the wiring 12 of the storage element 10 is connected to the source of the NMOS transistor 23, the drain of which is in turn connected to the drain of the PMOS transistor 22. Besides, the source of the PMOS transistor 22 is connected to the power supply 31 that provides a power supply potential Vdd. The NMOS transistors 21, 23, the PMOS transistor 22 and the power supply 31 together configure a read switching circuit.

Next, description is made to how the storage device 200 according to this embodiment works.

The operation of writing information in the storage device 200 of this embodiment is the same as the first embodiment. That is, the NMOS transistors 20 and 21 of the storage device 200 are switched to on state and the NMOS transistor 23 and the PMOS transistor 22 are switched to off state. As a result, a program potential Vpro provided by the power supply 30 is applied via the NMOS transistor 20 to the storage element 10. A write current Iwrite flows through the wiring 16 to the contact 15, then through the polysilicon wiring 4 to the contact 13 and to the wiring 14. Then, it flows to the NMOS transistor 21 in its on state. Some atoms of tungsten that constitute the contact 13 travel along the course of the electrons within the polysilicon wiring 4 to be deposited adjacent to the contact 15. Since some atoms of tungsten that constitute the contact 13 are leaked, resistance values of the contact 13 are increased accordingly. In this way, information is written to the storage element 10.

Next, description is made to the operation of reading information in the storage device 200 of this embodiment. The PMOS transistor 22 of the storage device 200 is first switched to on state and the NMOS transistors 20, 21 and 23 are switched to off state, thereby providing a high-potential state in the input node N1 of the latch circuit 40. Then, the PMOS transistor 22 is switched to off state and the NMOS transistors 23 and 21 are switched to on state. Such a high potential of the input node N1 is provided through the NMOS transistor 23 to the storage element 10. As a result, the resulting read current Iread flows from the wiring 12 to the contact 11, then through the polysilicon wiring 4 to the contact 13 and to the wiring 14. Then, the read current Iread flows to the NMOS transistor 21 in its on state. At this moment, if the above-mentioned write operation is not performed, the contact 13 of the storage element 10 is in a low-resistance state. In this case, a read current Iread flows through the storage element 10 to the NMOS transistor 21, thereby providing a low-resistance state in the input node N1 of the latch circuit 40. Alternatively, if the write operation is performed, the contact 13 of the storage element 10 is in a high-resistance state. In the latter case, a read current Iread is prevented from flowing through the storage element 10 to the NMOS transistor 21 and the input node N1 of the latch circuit 40 remains in a high-potential state. The latch circuit 40 retains the information written to the storage element 10 by means of such high- and low-potential states of the input node N1.

Also in the storage device 200 of this embodiment, a read current Iread will not flow in a read operation through the contact 15 adjacent to which tungsten is deposited. Accordingly, the tungsten deposited adjacent to the contact 15 will not return to the contact 13 due to the read current Iread. Since the contact 13 remains in a high-resistance state, the content of the already-written information may be retained without change and thus read in an accurate manner.

In addition, the storage device 200 of this embodiment is configured to use an NMOS transistor 21 in common as a switching element for both operations of writing and reading information. Consequently, reduction in number of elements used in the storage device 200 and less complicated configuration may be achieved.

As can be seen from the above, according to the storage device 200 of this embodiment, already-written information cannot be changed due to the voltage applied in an operation of reading information.

Third Embodiment

Figure 4:
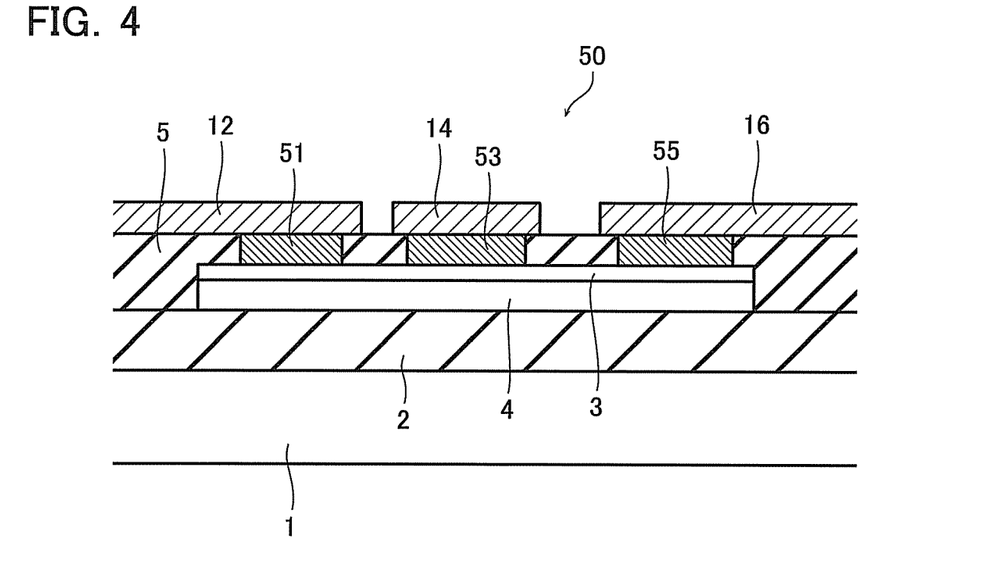
FIG. 4 is a cross-sectional view of a storage element used in a storage device according to a third embodiment of the present invention.
Figure 5:
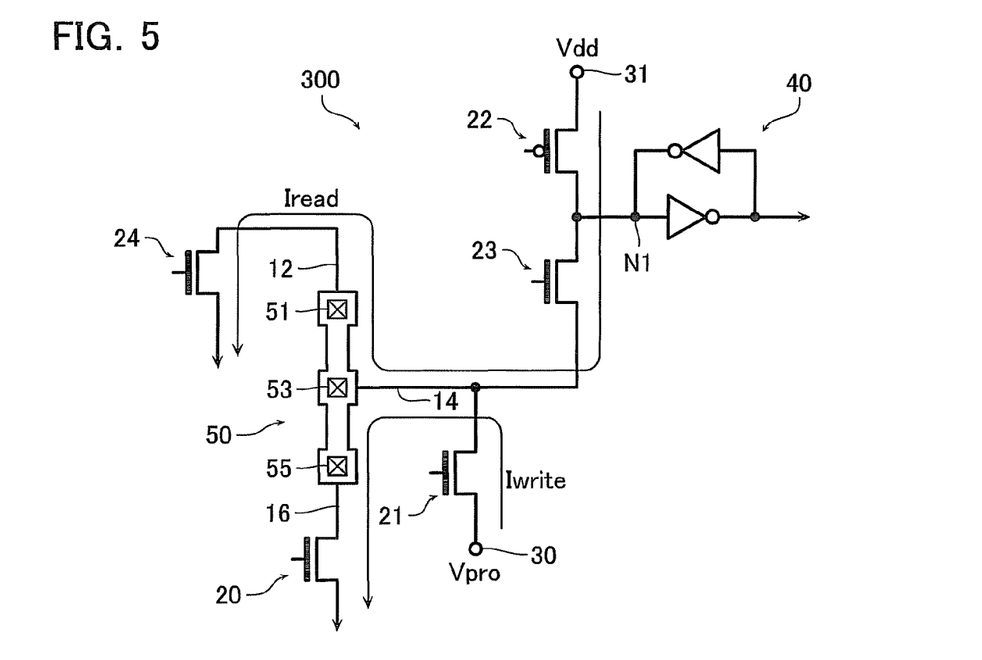
FIG. 5 is a circuit diagram of the storage device according to the third embodiment of the present invention.

A third embodiment of the present invention will now be described below with reference to the accompanying drawings. FIG. 4 is a cross-sectional view of a storage element 50 used in a storage device 300 according to this embodiment. The storage element 50 has a configuration that is substantially the same as the first embodiment illustrated in FIG. 1. The storage element 50 according to this embodiment is different from the storage element of the first embodiment in that it uses, e.g., silver (Ag) as second conductors with a second conductivity to form contacts 51, 53 and 55. FIG. 5 is a circuit diagram of a storage device 300 according to a third embodiment. The same reference numerals represent the same elements as the first embodiment.

In the storage device 300 according to this embodiment, the wiring 14 of the storage element 50 is connected to the source of the NMOS transistor 21, the drain of which is in turn connected to the power supply 30 that provides a program potential Vpro. In addition, the storage device 300 is different from the storage device of the first embodiment in that the wiring 16 of the storage element 50 is connected to the drain of the NMOS transistor 20 and the source of the NMOS transistor 20 is set to a ground potential. The NMOS transistors 20, 21 and the power supply 30 together configure a write switching circuit.

The NMOS transistors 23 and 24, the PMOS transistor 22, the power supply 31 and the latch circuit 40 are the same as those of the storage device 100 according to the first embodiment.

Next, description is made to how the storage device 300 according to this embodiment works.

The operation of writing information in the storage device 300 of this embodiment will be described below. The NMOS transistors 20 and 21 of the storage device 300 are switched to on state and the NMOS transistors 23 and 24 as well as the PMOS transistor 22 are switched to off state. As a result, a program potential Vpro provided by the power supply 30 is applied via the NMOS transistor 21 to the storage element 50. A write current Iwrite flows from the wiring 14 to the contact 53, then through the polysilicon wiring 4 to the contact 55 and to the wiring 16. Then, it flows to the NMOS transistor 20 in its on state. In this case, some atoms of silver that constitute the contact 53, unlike atoms of tungsten, travel in the opposite direction to that of the electrons flow (i.e., in the direction of the write current Iwrite flows) within the polysilicon wiring 4 to be deposited adjacent to the contact 55. Since some atoms of silver that constitute the contact 53 are leaked, resistance values of the contact 53 are increased accordingly. In this way, information is written to the storage element 50.

The operation of reading information in the storage device 300 of this embodiment is the same as the first embodiment. That is, the PMOS transistor 22 of the storage device 300 is switched to on state and the NMOS transistors 20, 21, 23 and 24 are switched to off state, thereby providing a high-potential state in the input node N1 of the latch circuit 40. Then, the PMOS transistor 22 is switched to off state and the NMOS transistors 23 and 24 are switched to on state. Such a high potential of the input node N1 is provided through the NMOS transistor 23 to the storage element 50. The resulting read current Iread flows from the wiring 14 to the contact 53, then through the polysilicon wiring 4 to the contact 51 and to the wiring 12. Then, the read current Iread flows to the NMOS transistor 24 in its on state. At this moment, if the above-mentioned write operation is not performed, the contact 53 of the storage element 50 is in a low-resistance state. In this case, a read current Iread flows through the storage element 50 to the NMOS transistor 24, thereby providing a low-potential state in the input node N1 of the latch circuit 40. Alternatively, if the write operation is performed, the contact 53 of the storage element 50 is in a high-resistance state. In the latter case, a read current Iread is prevented from flowing through the storage element 50 to the NMOS transistor 24 and the input node N1 of the latch circuit 40 remains in a high-potential state. The latch circuit 40 retains the information written to the storage element 50 by means of such high- and low-potential states of the input node N1.

In the storage device 300 of this embodiment, a read current Iread will not flow in a read operation through the contact 55 adjacent to which silver is deposited. Accordingly, the silver deposited adjacent to the contact 55 will not return to the contact 53 due to the read current Iread. Since the contact 53 remains in a high-resistance state, the content of the already-written information may be retained without change and thus read in an accurate manner.

As can be seen from the above, according to the storage device 300 of this embodiment, already-written information cannot be changed due to the voltage applied in an operation of reading information. As with the storage device 300 of this embodiment, the present invention may also be implemented by using substances as second conductors that travel in the opposite direction to that of electrons flow. For example, gold (Au) can be used as these substances.

Fourth Embodiment

Figure 6:
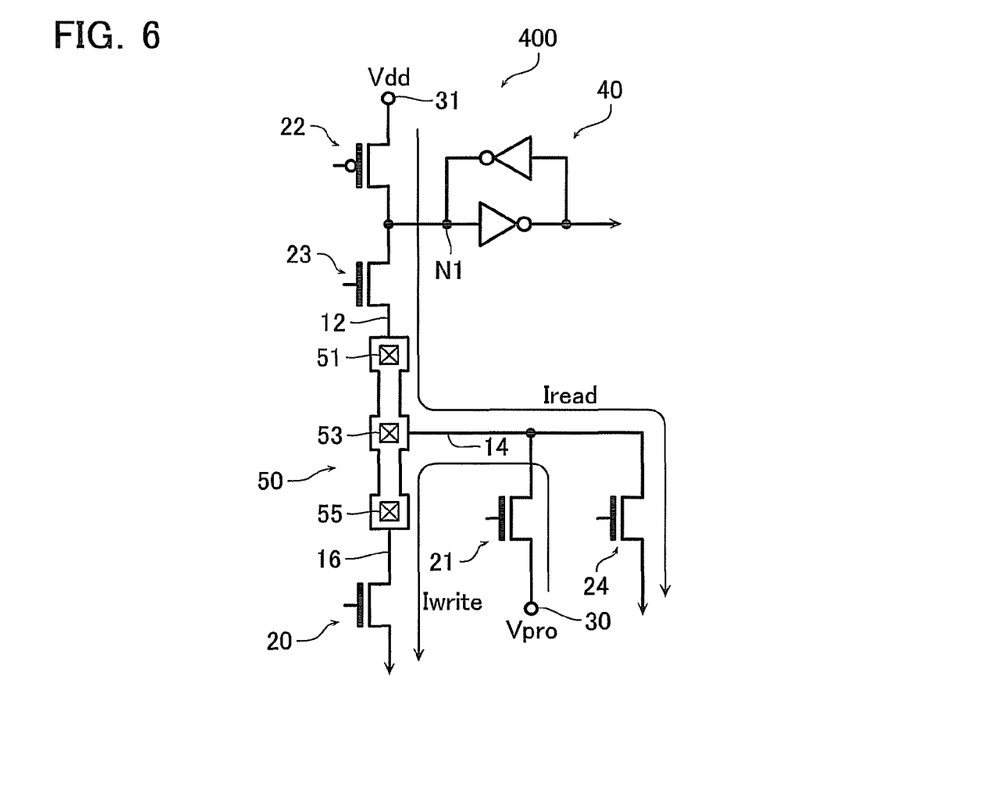
FIG. 6 is a circuit diagram of a storage device according to a fourth embodiment of the present invention.

A fourth embodiment of the present invention will now be described below with reference to the accompanying drawings. FIG. 6 is a circuit diagram of a storage device 400 according to the fourth embodiment. The same reference numerals represent the same elements as the first embodiment. The configuration of the storage element 50 used in the storage device 400 according to this embodiment is the same as the third embodiment illustrated in FIG. 4.

In the storage device 400 according to this embodiment, a write switching circuit configured by the NMOS transistors 20 and 21 as well as the power supply 30 is the same as that of the storage device 300 according to the third embodiment.

In the storage device 400 according to this embodiment, the storage device 400 is different from the storage device of the third embodiment in view of following. That is, the wiring 12 of the storage element 50 is connected to the source of the NMOS transistor 23. The drain of the NMOS transistor 23 is connected to the drain of the PMOS transistor 22, the source of which is in turn connected to the power supply 31 that provides a power supply potential Vdd. Then, the wiring 14 of the storage element 50 is connected to the drain of the NMOS transistor 24. The NMOS transistors 23, 24, the PMOS transistor 22 and the power supply 31 together configure a read switching circuit.

Next, description is made to how the storage device 400 according to this embodiment works.

The operation of writing information in the storage device 400 of this embodiment is the same as the third embodiment. That is, the NMOS transistors 20 and 21 of the storage device 400 are switched to on state and the NMOS transistors 23 and 24 as well as the PMOS transistor 22 are switched to off state. As a result, a program potential Vpro provided by the power supply 30 is applied via the NMOS transistor 21 to the storage element 50. A write current Iwrite flows from the wiring 14 to the contact 53, then through the polysilicon wiring 4 to the contact 55 and to the wiring 16. Then, it flows to the NMOS transistor 20 in its on state. In this case, some atoms of silver that constitute the contact 53 travel in the opposite direction to that of the electrons flow (i.e., in the direction of the write current Iwrite flows) within the polysilicon wiring 4 to be deposited adjacent to the contact 55. Since some atoms of silver that constitute the contact 53 are leaked, resistance values of the contact 53 are increased. In this way, information is written to the storage element 50.

The operation of reading information in the storage device 400 of this embodiment will be described below. The PMOS transistor 22 of the storage device 400 is first switched to on state and the NMOS transistors 20, 21, 23 and 24 are switched to off state, thereby providing a high-potential state in the input node N1 of the latch circuit 40. Then, the PMOS transistor 22 is switched to off state and the NMOS transistors 23 and 24 are switched to on state. Such a high potential of the input node N1 is provided through the NMOS transistor 23 to the storage element 50. The resulting read current Iread flows from the wiring 12 to the contact 51, then through the polysilicon wiring 4 to the contact 53 and to the wiring 14. Then, the read current Iread flows to the NMOS transistor 24 in its on state. At this moment, if the above-mentioned write operation is not performed, the contact 53 of the storage element 50 is in a low-resistance state. In this case, a read current Iread flows through the storage element 50 to the NMOS transistor 24, thereby providing a low-potential state in the input node N1 of the latch circuit 40. Alternatively, if the write operation is performed, the contact 53 of the storage element 50 is in a high-resistance state. In the latter case, a read current Iread is prevented from flowing through the storage element 50 to the NMOS transistor 24 and the input node N1 of the latch circuit 40 remains in a high-potential state. The latch circuit 40 retains the information written to the storage element 50 by means of such high- and low-potential states of the input node N1.

Also in the storage device 400 of this embodiment, a read current Iread will not flow in a read operation through the contact 55 adjacent to which silver is deposited. Accordingly, the silver deposited adjacent to the contact 55 will not return to the contact 53 due to the read current Iread. Since the contact 53 remains in a high-resistance state, the content of the already-written information may be retained without change and thus read in an accurate manner.

As can be seen from the above, according to the storage device 400 of this embodiment, already-written information cannot be changed due to the voltage applied in an operation of reading information.

Although embodiments of the present invention have been described, the present invention is not intended to be limited to the disclosed embodiments and various other changes, additions or the like may be made thereto without departing from the spirit of the invention.

Figure 7:
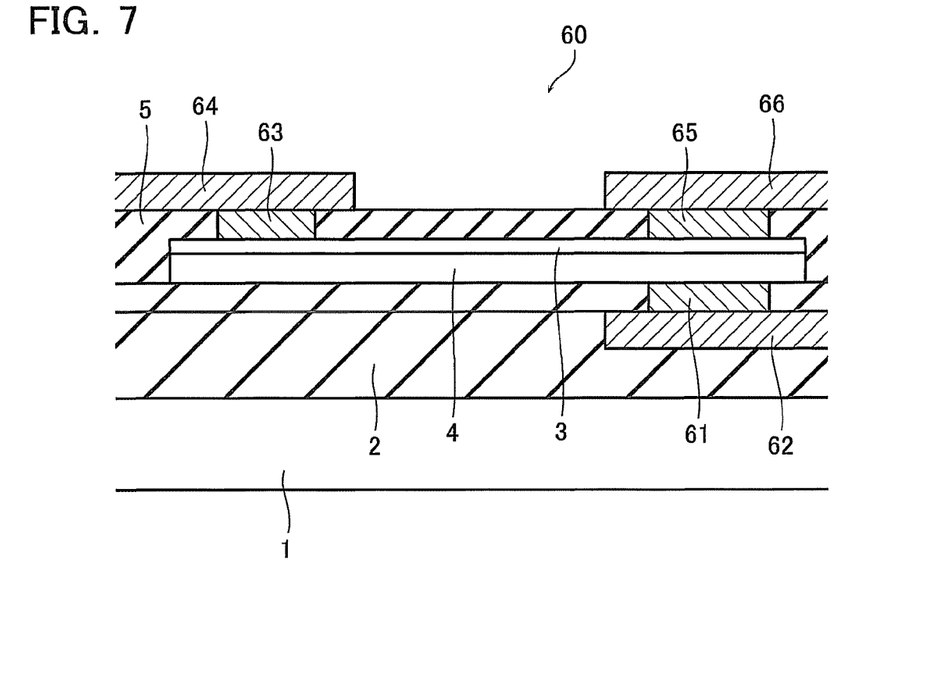
FIG. 7 is a cross-sectional view of another exemplary storage element used in a storage device according to an embodiment of the present invention.

While in the above-mentioned embodiments the wirings 12, 14 and 16 connected to the polysilicon wiring 4 as well as the contacts 11, 13 and 15 are formed on the same layer on the semiconductor substrate 1, these wirings and contacts may be formed on a different layer, as illustrated in FIG. 7. The storage device circuit is configured as illustrated in FIG. 2 through formation of contacts 61, 63 and 65 with tungsten and correspondence of wirings 62, 64 and 66 with the wirings 12, 14 and 16, respectively. In this case, a write current Iwrite flows from the wiring 66 to the contact 65, then through the polysilicon wiring 4 to the contact 63 and to the wiring 64. Some atoms of tungsten that constitute the contact 63 travel within the polysilicon wiring 4 to be deposited adjacent to the contact 65. Since some atoms of tungsten that constitute the contact 63 are leaked, resistance values of the contact 63 are increased. Then, a read current Iread flows from the wiring 64 to the contact 63, then through the polysilicon wiring 4 to the contact 61 and to the wiring 62. The tungsten deposited adjacent to the contact 65 will not return to the contact 63 due to the read current Iread. Also in this case, since the contact 63 remains in a high-resistance state, the content of the already-written information may be retained without change and thus read in an accurate manner.

Figure 8:
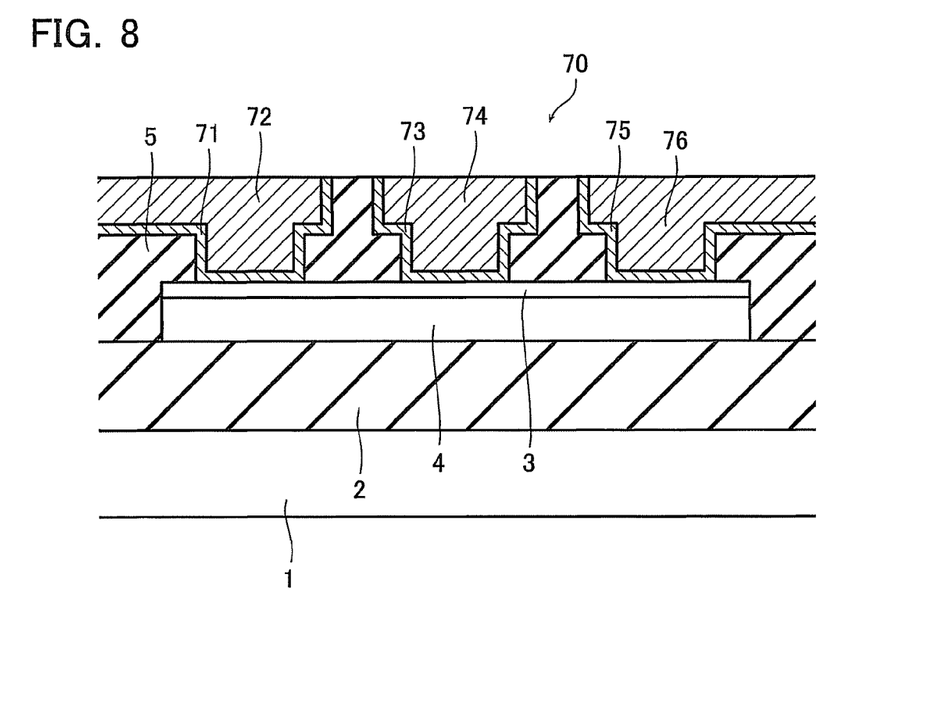
FIG. 8 is a cross-sectional view of still another exemplary storage element used in a storage device according to an embodiment of the present invention.

In addition, as illustrated in FIG. 8, barrier metal films 71, 73 and 75 of, e.g., titanium (Ti) may be provided for preventing copper used in wirings 72, 74 and 76 from diffusing into the interlayer insulating film 5 and they may also be used as second conductors. The storage device circuit is configured as illustrated in FIG. 2 through correspondence of the wirings 72, 74 and 76 with the wirings 12, 14 and 16, respectively. In this case, a write current Iwrite flows from the wiring 76 through the polysilicon wiring 4 to the wiring 74. At this moment, some atoms of titanium that constitute the barrier metal film 73 travel within the polysilicon wiring 4 to be deposited adjacent to the barrier metal film 75. Since some atoms of titanium that constitute the barrier metal film 73 are leaked, resistance values of the wiring 74 are increased. Then, a read current Iread flows from the wiring 74 through the polysilicon wiring 4 to the wiring 72. The titanium deposited adjacent to the barrier metal film 75 will not return to the barrier metal film 73 side due to the read current. Also in this case, since the wiring 74 remains in a high-resistance state, the content of the already-written information may be retained without change and thus read in an accurate manner. As such barrier metal films, for example, titanium nitride (TiN), tantalum (Ta), tantalum nitride (TaN), etc., may be used in addition to titanium.

What is claimed is:

1. A storage device comprising:
   a wiring including a first conductor with a first conductivity;
   first, second and third contacts, each including a second conductor with a second conductivity and contacting the wiring;
   a write switching circuit controlling current for writing information that flows through the first contact, the wiring, and the second contact, and changing resistance values of the first contact to write information; and
   a read switching circuit controlling current for reading information that flows through the first contact, the wiring, and the third contact.

2. The storage device according to claim 1, wherein the first, second and third contacts are formed in line along the wiring and the first contact is formed between the second contact and the third contact.

3. The storage device according to claim 1, wherein atoms constituting the second conductor travels in the opposite direction to that of the current for writing information flows within the wiring.

4. The storage device according to claim 1, wherein the first conductor is polysilicon and the second conductor is tungsten.

5. The storage device according to claim 1, wherein atoms constituting the second conductor travels along the direction of the current for writing information flows within the wiring.

6. The storage device according to claim 1, wherein the first conductor is polysilicon and the second conductor is silver or gold.

7. The storage device according to claim 1, wherein the first contact is formed on one surface of the wiring and the second contact or the third contact is formed on the other surface of the wiring.

8. The storage device according to claim 1, wherein the first, second and third contacts are barrier metal films formed to contact the wiring.

9. The storage device according to claim 1, wherein the current for reading information flows from the first contact through the wiring to the third contact.

10. The storage device according to claim 1, wherein the current for reading information flows from the third contact through the wiring to the first contact.

* * * * *